United States Patent [19]
Smithers et al.

[11] Patent Number: 6,032,788
[45] Date of Patent: Mar. 7, 2000

[54] MULTI-RAIL BOARD TRANSPORT SYSTEM

[75] Inventors: Mark W. Smithers, Framingham; John De Piano, Jr., Burlington; Robert Treiber, II, Medfield, all of Mass.; Kevin P. Kellar, Stony Brook, N.Y.

[73] Assignee: DEK Printing Machines Limited, Weymouth, United Kingdom

[21] Appl. No.: 09/031,003

[22] Filed: Feb. 26, 1998

[51] Int. Cl.[7] .................................................. B65G 15/10
[52] U.S. Cl. ............................................................ 198/817
[58] Field of Search ............................................. 198/817

[56] References Cited

U.S. PATENT DOCUMENTS

| | | | |
|---|---|---|---|
| 3,965,523 | 6/1976 | Elliott | 198/817 |
| 4,804,081 | 2/1989 | Lenhardt | 198/817 |
| 4,917,226 | 4/1990 | Blocker | 198/817 |
| 5,009,306 | 4/1991 | Roderick et al. | 198/817 |
| 5,348,033 | 9/1994 | Levit | 198/817 |
| 5,566,816 | 10/1996 | Gross et al. | 198/817 |
| 5,576,520 | 11/1996 | Waterman et al. | 198/817 |
| 5,628,605 | 5/1997 | Miyoshi | 198/817 |
| 5,737,834 | 4/1998 | Sabotke et al. . | |
| 5,797,481 | 8/1998 | Uber et al. | 198/817 |
| 5,873,939 | 2/1999 | Doyle et al. . | |

FOREIGN PATENT DOCUMENTS

| | | | |
|---|---|---|---|
| 4-129630 | 4/1992 | Japan . | |
| WO 98/37741 | 8/1998 | WIPO | H05K 3/12 |

OTHER PUBLICATIONS

English Language Abstract of Japanese Patent No. 4–129630, Apr. 30, 1992.
Universal Instruments, Inc. Technical Doc. No. T46101902.

*Primary Examiner*—Joseph E. Valenza
*Attorney, Agent, or Firm*—Orrick, Herrington & Sutcliffe LLP

[57] ABSTRACT

A multi-rail transport system for transporting printed circuit boards along adjacent pairs of rails including first and second brake rods having parallel longitudinal axes and a plurality of brake cylinders slideably mounted on the brake rods, wherein each of the brake cylinders is adapted to be actuated between an engaged condition in which the brake cylinders are fixed in position and a disengaged condition in which the brake cylinders are free to slide along the brake rods. Also provided is a plurality of rails mounted to corresponding pairs of the brake cylinders. The system further includes first and second shuttles movably mounted adjacent to the brake rods, the shuttles being adapted to move in directions substantially parallel to the first and second longitudinal axes and to selectively engage the rails. The present invention also relates a method of adjusting rails including providing a plurality of rails along an axis of movement, each of the rails being adapted to be switched between a first condition in which the rails are fixed in position, and a second condition in which the rails are free to move, and providing a shuttle moveable along the axis of movement, the shuttle being adapted to selectively engage and disengage each of the rails. The method further includes moving the shuttle to a position adjacent to one of the rails, switching the rail to the second condition, engaging the rail with the shuttle, moving the shuttle and the rail to a new position, switching the rail to the first condition, and disengaging the rail with the shuttle. Also described is a custom extruded belt for use in the multi-rail system which includes a substantially flat surface for supporting the printed circuit boards.

29 Claims, 17 Drawing Sheets

Microfiche Appendix Included
(2 Microfiche, 117 Pages)

MULTI-RAIL BOARD TRANSPORT SYSTEM

MICROFICHE APPENDIX

A Microfiche Appendix is attached hereto and forms a part of this application. The Microfiche Appendix, which is a computer program listing printout, includes 2 microfiche with a total of 117 frames.

FIELD OF THE INVENTION

The present invention relates to a system for transporting loads such as printed circuit boards, in particular to a multi-rail, multi-lane transport system for transporting printed circuit boards of varying sizes within and between automatic electronics assembly equipment such as screen printing machines, electronic component "pick-and-place" machines and reflow ovens.

BACKGROUND

Printed circuit boards having electronic components mounted on the surface thereof (or having components mounted thereon by placement of the leads of the components through holes in the circuit board) are currently mass produced in assembly line fashion using automated manufacturing equipment. Typically, at least three well-known manufacturing steps are involved in the manufacture of such printed circuit boards. A block diagram illustrating these steps and the required manufacturing equipment is shown in FIG. 1.

In the first step, solder paste or some other viscous material is applied to the surface of a printed circuit board in a specific pattern through a screen or stencil using a screen printing machine 10. Screen printing machines are well-known in the art and are commercially available from a number of sources, an example of which is the DEK model 265 GSX screen printing machine manufactured and sold by the assignee of the present invention DEK Printing Machines Limited.

Once the solder paste has been applied to the surface of the printed circuit board using screen printing machine 10, the next step involves placing the desired electronic components on the printed circuit board in particular locations. This task is performed quickly and automatically through the use of an automated component handling and placement machine 20, commonly referred to as a "pick and place" machine, shown in FIG. 1. Such machines typically have a placement head which picks up a series of components from a supply area and then places those components at desired locations on the printed circuit board (hence the name "pick-and-place" machines). Automated component handling and placement machines are well-known in the art and are commercially available from a number of sources, an example of which is the Universal Instruments model GSM machine, which is available from Universal Instruments Corporation in Binghamton, N.Y.

Once the desired electronic components have been placed by the automated component handling and placement machine 20 at the desired location on the board, a typical further manufacturing step is performed, which is commonly known as reflowing the solder paste. During this step, the printed circuit board having components placed thereon is placed inside a reflow oven 30 shown in FIG. 1 and the temperature inside the reflow oven 30 is raised. As a result of the increased temperature, the solder paste on the surface of the printed circuit board melts and wicks up the leads/ends of the electronics components, thereby creating a satisfactory electrical connection between the printed circuit board and the electronic components. Refold ovens are well-known in the art and are commercially available from a number of sources, including American Soltec, Inc. of Manchester, N.H.

During the manufacturing steps described above, which is just one example of the many different processes available in electronics manufacturing, the printed circuit boards are typically transported through and between the automated manufacturing equipment on what are commonly called rails, denoted in FIG. 1 by reference 35. In particular, each rail generally comprises a motor driven belt and pulley or chain system integrated with a support structure. Each printed circuit board is supported along its opposite side edges by first and a second rails, respectively, the printed circuit boards actually resting on the belts of the rails with support being provided by the support structure. Thus, as the belts move, the printed circuit boards are transported along the rails. The first and second rails on which the printed circuit boards are transported from what is commonly called a lane, and thus the printed circuit boards are said to be transported along the lane.

In many prior art systems, one rail forming a lane is typically fixed in position. The other rail forming the lane may also be fixed, may be manually adjustable, or may be automatically adjustable typically by coupling the rail to a ball screw and nut driven by a stepper motor, in order to accommodate printed circuit boards of different widths.

In order to increase manufacturing capacity, it has become desirable to increase the number of lanes so that more than one printed circuit board can be transported through the manufacturing system at a single time. Doing so by utilizing the prior art rail technology described above would thus require each lane to include a fixed rail and an adjustable rail having its own ball screw drive system. Thus, each additional lane would result in additional required component parts, thereby adding complexity and expense to the board transport system.

SUMMARY OF THE INVENTION

The present invention relates to a multi-rail transport system for transporting printed circuit boards or similar loads along adjacent pairs of rails. The present invention can be used in conjunction with, for example, a screen printing machine or any other machinery or equipment used in the manufacture, inspection or testing of printed circuit boards. The present invention can also be used in conjunction with any system that transports loads along rails.

In one aspect, the multi-rail transport system includes a first brake rod having a first longitudinal axis and a plurality of first brake cylinders slideably mounted on the first brake rod, wherein each of the first brake cylinders is adapted to be actuated between an engaged condition in which the first brake cylinder is fixed in position and a disengaged condition in which the first brake cylinder is free to slide along the first brake rod. In addition, the system includes a second brake rod having a second longitudinal axis which is parallel to the first longitudinal axis and a plurality of second brake cylinders, each of the second brake cylinders being slideably mounted on the second brake rod in a position directly opposite a corresponding one of the first brake cylinders. The second brake cylinders and the corresponding first brake cylinders form a plurality of corresponding pairs of brake cylinders. Each of the second brake cylinders is adapted to be actuated between an engaged condition in which the second brake cylinder is fixed in position and a disengaged condition in which the second brake cylinder is free to slide along the second brake rod. Also provided is a plurality of rails having first and second ends, each of the rails being mounted to one of the corresponding pairs of brake cylinders by fixing the first end of the rail to the first brake cylinder of the corresponding pair of brake cylinders and by fixing the second end of the rail to the second brake cylinder of the corresponding pair of brake cylinders. The system further includes first and second shuttles moveably mounted adjacent the first and second brake rods, respectively, the first shuttle being adapted to move in a first direction substantially parallel to the first longitudinal axis and to selectively engage the first ends of the rails, and the second shuttle being adapted to move in a second direction substantially parallel to the second longitudinal axis and to selectively engage the second ends of the rails.

According to a further aspect of the present invention, a method of adjusting rails in a multi-rail transport system for transporting printed circuit boards is described. The method includes providing a plurality of rails along an axis of movement, each of the rails being adapted to be switched between a first condition in which the rails are fixed in position along the axis of movement, and a second condition in which the rails are free to move along the axis of movement, and providing a shuttle moveable along the axis of movement, the shuttle being adapted to selectively engage and disengage each of the rails such that when the shuttle engages a rail, the shuttle and the engaged rail are linked to one another. The method further includes moving the shuttle along the axis of movement to a position adjacent to a selected one of the rails, switching the selected one of the rails to the second condition, engaging the selected one of the rails with the shuttle, moving the shuttle and the selected one of the rails to a new position along the axis of movement, switching the selected one of the rails to the first condition, and disengaging the selected one of the rails with the shuttle.

According to another aspect of the present invention, a rail for a system for transporting printed circuit boards along adjacent pairs of rails is described. The rail includes a belt having a cross section having a substantially flat surface for supporting the printed circuit boards, a pulley, the pulley and the belt being coupled to one another, a motor for driving the pulley, and a support structure having a groove adapted to receive the belt.

According to a still further aspect of the present invention, an extruded belt for use in a system for transporting printed circuit boards is described, wherein the belt comprises an elongated body having a substantially flat surface for supporting the printed circuit boards.

BRIEF DESCRIPTION OF THE DRAWINGS

Further features and advantages of the invention will be apparent upon consideration of the following detailed description of the present invention, taken in conjunction with the following drawings, in which like reference characters refer to like parts, and in which.

DETAILED DESCRIPTION

Figure 1:
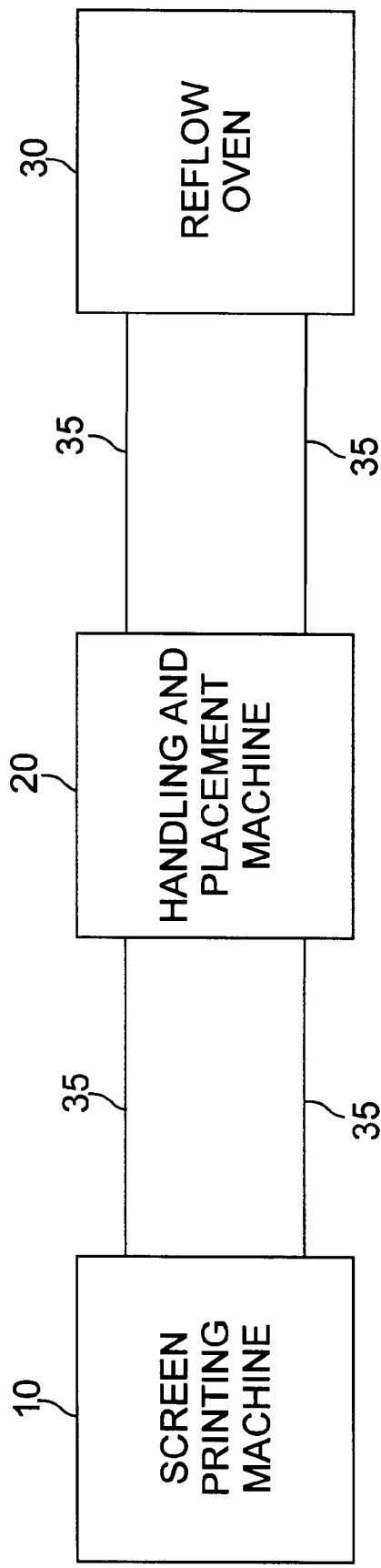
FIG. 1 is a block diagram of an example of a single lane prior art printed circuit board assembly system.
Figure 2:
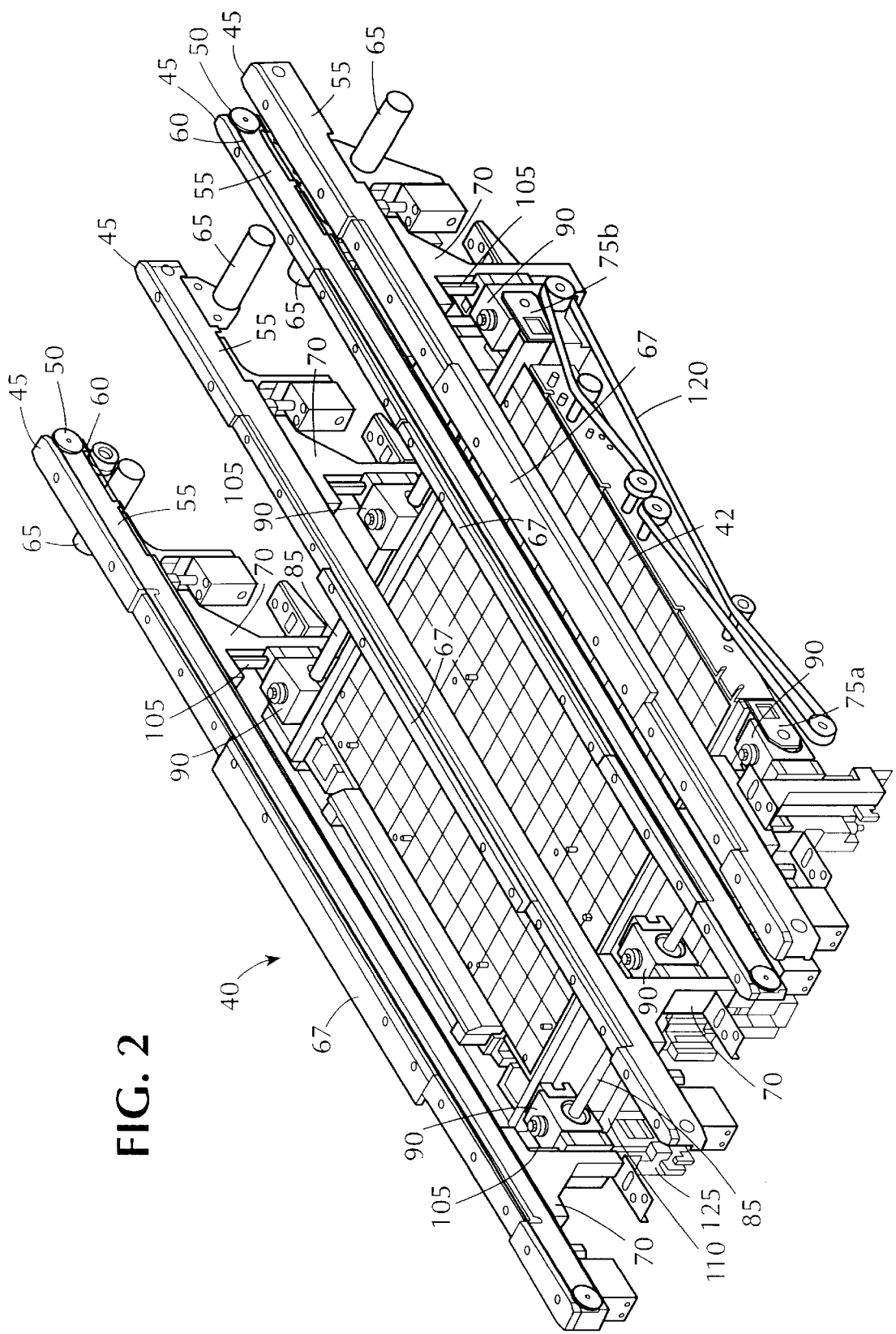
FIG. 2 is a perspective view of an embodiment of a multi-rail, multi-lane transport system according to an aspect of the present invention.
Figure 3:
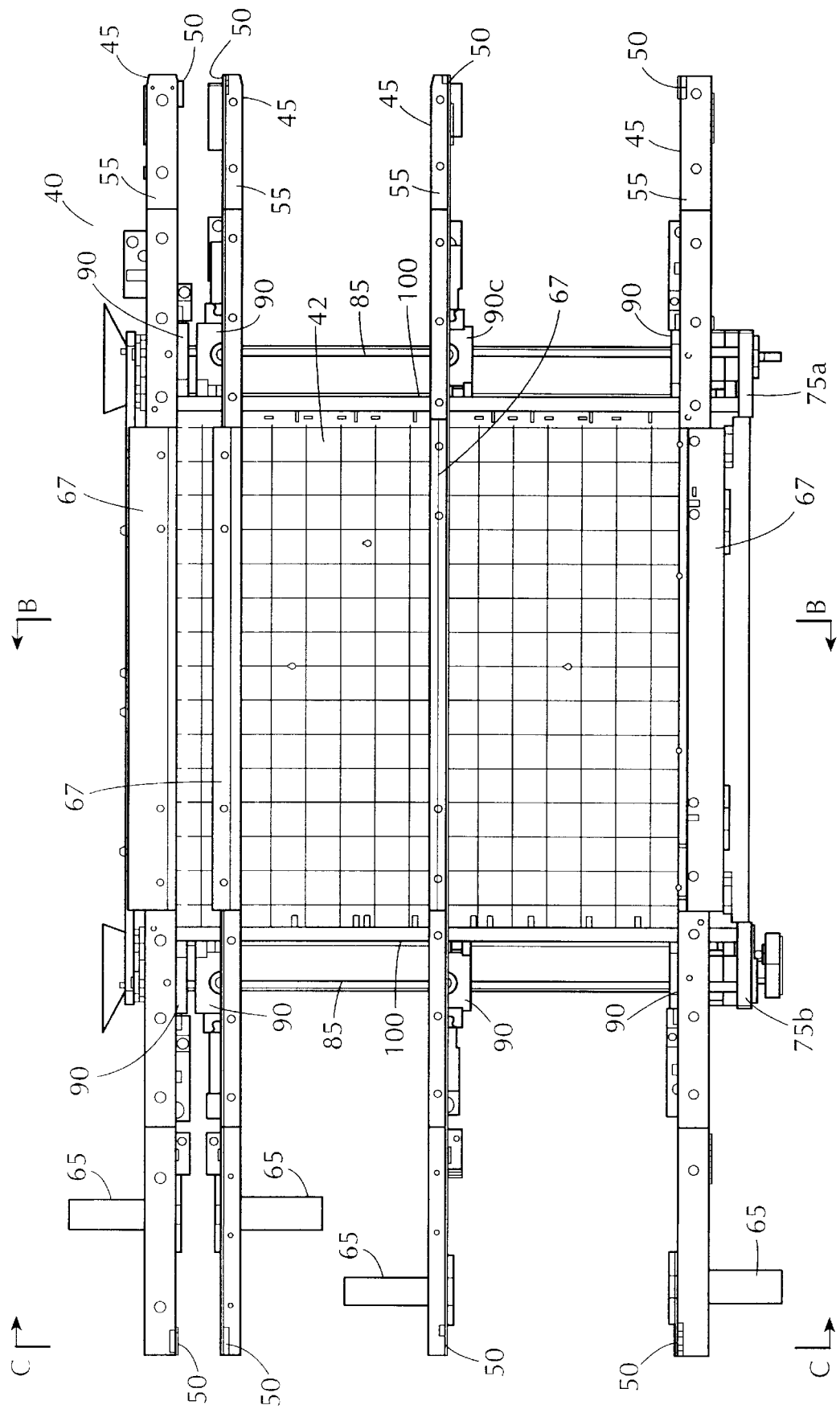
FIG. 3 is a top view of the multi-rail, multi-lane transport shown in FIG. 2.
Figure 4:
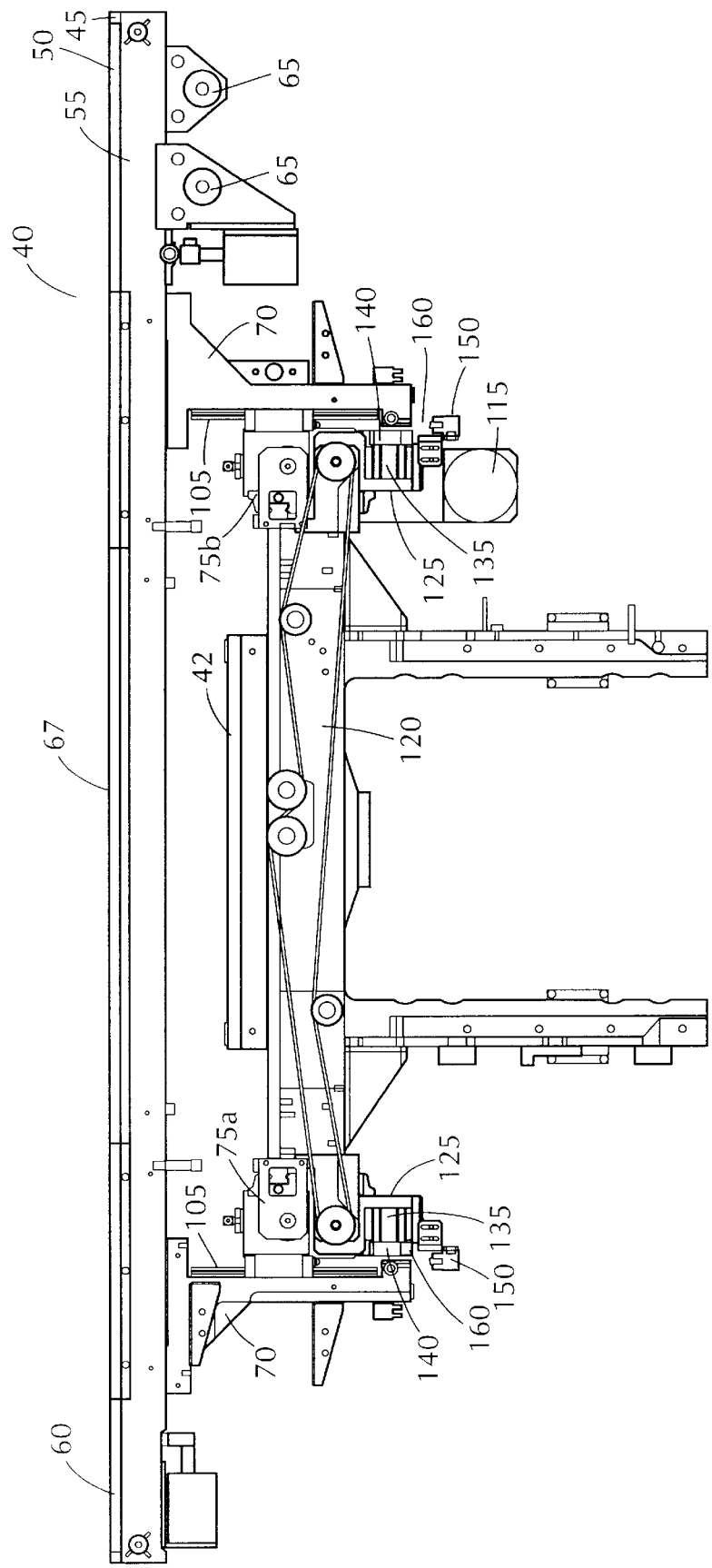
FIG. 4 is a side view of the multi-rail, multi-lane transport system shown in FIG. 2.

Referring to FIGS. 2, 3 and 4, respectively, perspective, top and side views of the multi-rail, multi-lane transport system 40 according to an aspect of the present invention are shown. For illustrative purposes, the system 40 is shown as part of a screen printing machine which includes table 42 having board tooling which is raised to provide support to the printed circuit boards as the solder paste is applied to the surface thereof. It should be understood, however, that the present invention is not limited to use in connection with a screen printing machine, but instead can be applied to any electronics assembly equipment that transports printed circuit boards. In addition, the present invention can be applied to any system or machine in which loads, which may, for example, include silicon wafers, ceramics, carriers or the like, are conveyed. Printed circuit boards, silicon wafers, ceramics, carriers and the like are commonly called substrates. Thus, the multi-rail system of the present invention is particularly applicable to any system in which rigid or flexible substrates or similar loads are transported along rails for, among other things, manufacturing, inspection and testing.

System 40 includes rails 45 as generally described above, each rail 45 including pulley 50, support structure 55 and belt 60. The support structure 55 includes a groove adapted to receive and support belt 60. In addition, each rail 45 further includes belt drive motor 65 for driving the belt/pulley system. The belt drive motors 65 of each adjacent pair of rails 45 forming a lane are linked to one another electrically so as to operate at the same speed when conveying a printed circuit board. Each lane, however, is able to be run independently. Furthermore, each rail 45 includes clamping mechanism 67 for firmly securing the printed circuit boards in place as the solder paste is applied to the surface thereof.

Attached to the underside of each rail 45 on opposite sides thereof are first and second webs 70. Webs 70 are provided as an inter-connecting structure between rails 45 and first and second rail positioning mechanisms 75a and 75b, the specifics of which will be described below. As shown in FIGS. 2, 3 and 4, first and second rail positioning mechanisms 75a and 75b are affixed at opposite ends of table 42. Rail positioning mechanisms 75a and 75b are identical in structure and thus will at times be described below with reference to a generic rail positioning mechanism 75.

Figure 5:
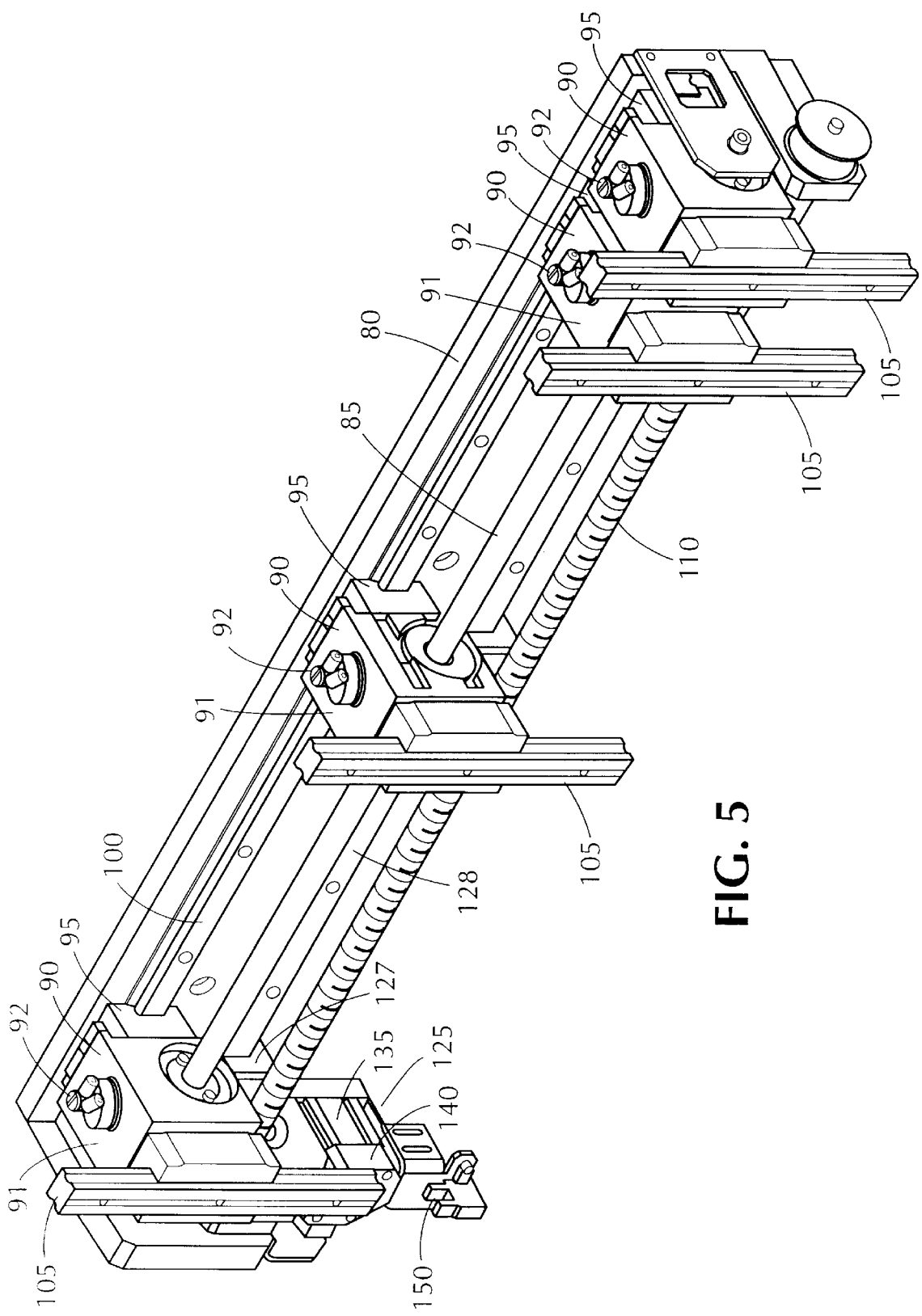
FIG. 5 is a perspective view of an embodiment of a rail positioning mechanism according to an aspect of the present invention.
Figure 6:
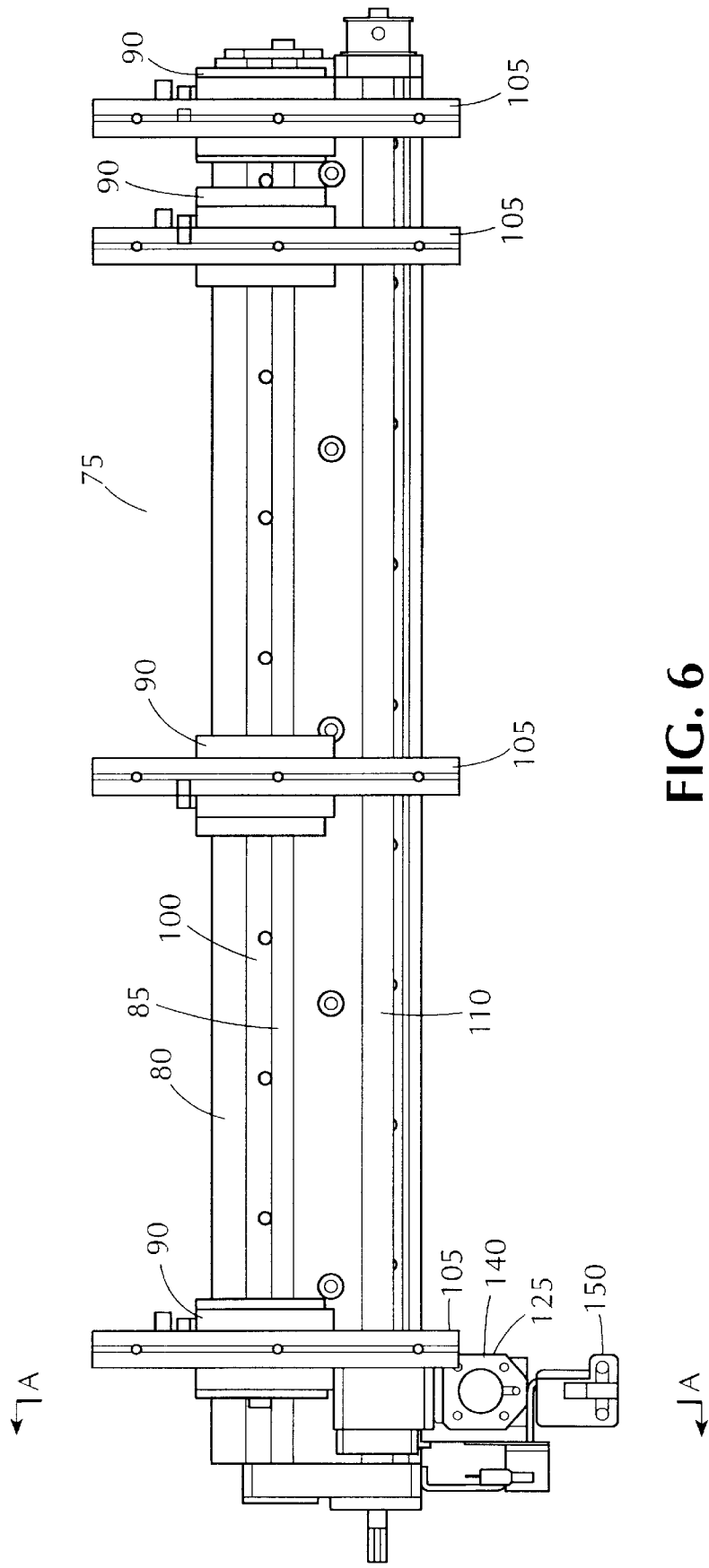
FIG. 6 is a side view of the rail positioning mechanism shown in FIG. 5.

Referring to FIGS. 5 and 6, perspective and side views, respectively, of rail positioning mechanism 75 are shown. Rail positioning mechanism 75 includes support structure 80 to which is fixedly attached cylindrical brake rod 85. Slideably coupled to a brake rod 85 are brake cylinders 90 having a brake cylinder block 91. In one embodiment of the present invention, brake cylinders 90 can each be independently and selectively engaged and disengaged pneumatically, the required air being supplied through nozzle 92. Suitable brake cylinders 90 are manufactured by and commercially available from Domatech, Inc. These brake cylinders are, however, provided as an example, and it should be understood that brake cylinders 90 can be any clamping mechanism that can be selectively engaged and disengaged as described below. In addition, brake cylinders 90 may also be manually or electrically actuated brake cylinders. When any one of brake cylinders 90 is engaged, that brake cylinder 90 will be fixed in position and will not slide along the length of brake rod 85. On the other hand, when any one of brake cylinders 90 is disengaged, that brake cylinder will be free to slide along the length of brake rod 85.

Attached to the brake cylinder block 91 of each brake cylinder 90 is guide piece 95 which is in sliding engagement with linear guide rail 100. Thus, when brake cylinders 90 are disengaged, their travel along brake rod 85 is aided by guide pieces 95 and guide rail 100. Suitable linear guide assemblies as just described are commercially available from THK Corporation.

As shown in FIGS. 5 and 6, attached to brake cylinders 90 on a side thereof opposite guide pieces 95 are rail supports 105. As shown in FIGS. 2 and 4, each of rails 45 is attached to a corresponding opposite pair of brake cylinders 90. Specifically, the webs 70 of each rail 45 are attached by screws to the rail supports 105 of the corresponding opposite pair of brake cylinders 90. Accordingly, by selectively engaging and disengaging brake cylinders 90, each rail 45 can selectively be fixed in place along the length of brake rods 85 of rail positioning mechanisms 75a and 75b or can be free to slide along brake rods 85 of rail positioning mechanisms 75a and 75b.

Referring again to FIGS. 5 and 6, support structure 80 of rail positioning mechanism 75 has rotatably affixed thereto ball screw 110. Ball screw 110 is driven by stepper motor 115 located to one side and below table 42 as shown in FIG. 4. As shown in FIG. 2, ball screw 110 of rail positioning mechanism 75a is coupled to ball screw 110 of rail positioning mechanism 75b by belt and pulley system 120. Therefore, only one stepper motor 115 is needed to drive in unison both ball screws 110. Alternatively, two electronically coupled stepper motors could be provided to independently drive each of the ball screws 110. Also, instead of a stepper motor or motors, a servo motor or motors could be used. In addition, ball nut 122, shown in FIG. 7 described below, is threaded onto ball screw 110. As ball screw 110 rotates, ball nut 122 moves back and forth along the length thereof. Ball screw drives are well known in the art and thus will not be described in greater detail herein.

Attached to ball nut 122 is shuttle 125. Thus, as ball nut 122 moves along the length of ball screw 110 due to the operation of the stepper motor 115, shuttle 125 moves along with it. Furthermore, attached to shuttle 125 is guide piece 127 which is in sliding engagement with linear guide rail 128. As shuttle 125 moves along the length of ball screw 110, its travel is aided by guide piece 128.

Instead of a ball screw drive system for moving the shuttles 125, any selectively controlled drive system could b used. For example, the ball screw drive system could be replaced by a belt drive or a chain drive system, which are well known in the art, to which the shuttles 125 are coupled without departing from the scope of the present invention.

Figure 7:
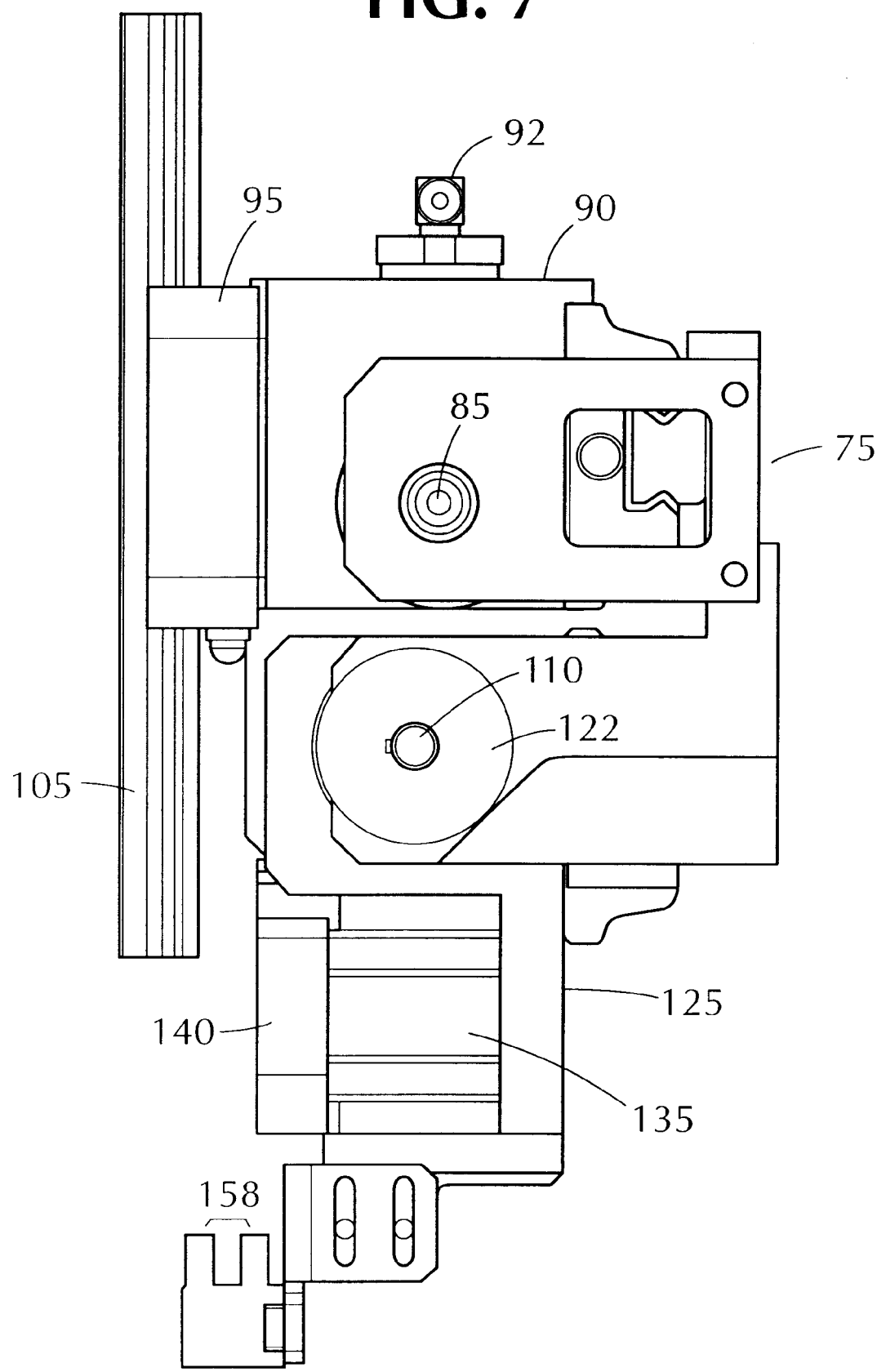
FIG. 7 is a front view of the rail positioning mechanism shown in FIGS. 5 and 6.
Figure 8:
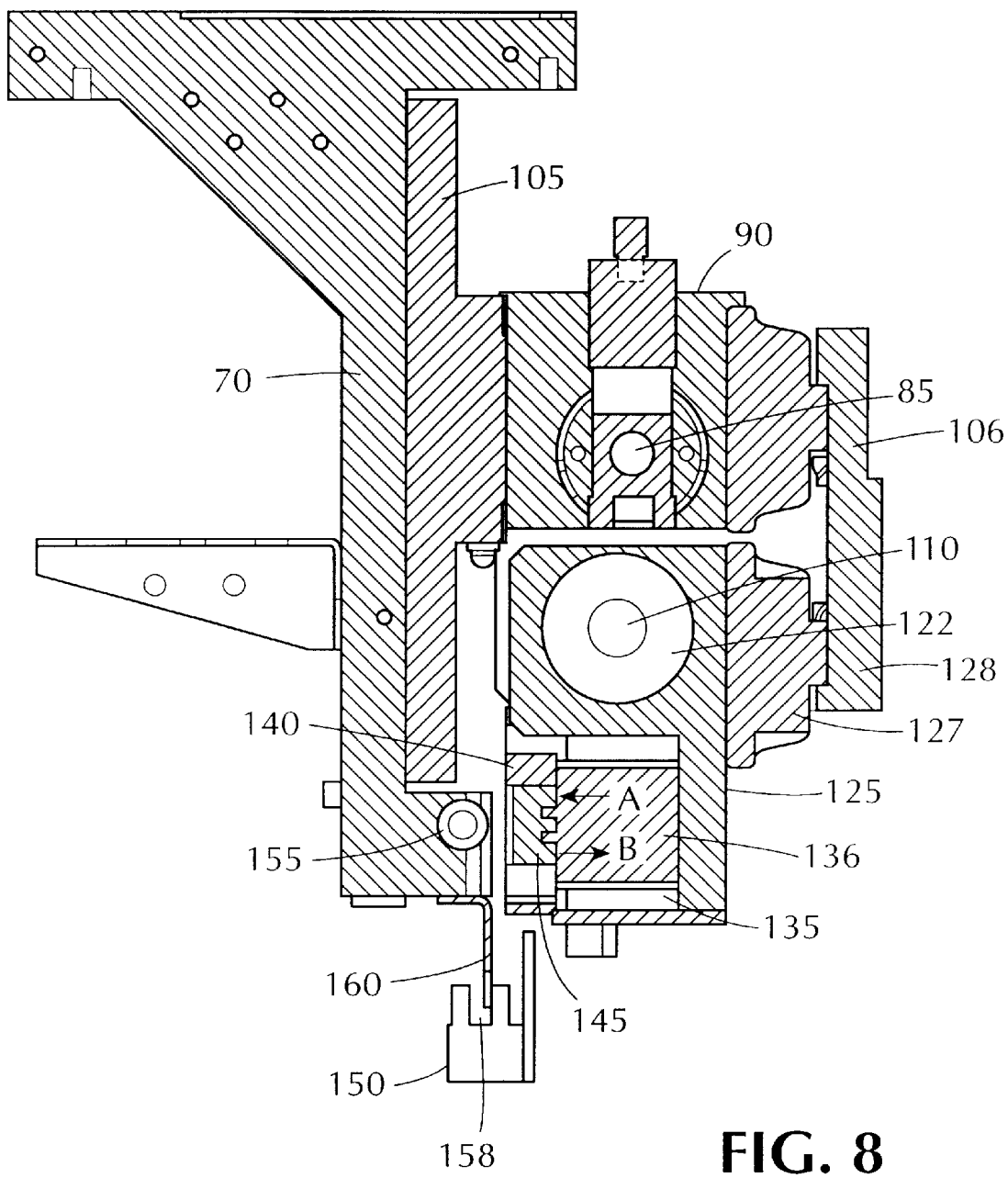
FIG. 8 is a cross-sectional diagram of the rail positioning mechanism shown in FIGS. 5, 6 and 7 taken lines A—A of FIG. 6 which further includes a web of a rail.

FIG. 7 is a front view of rail positioning mechanism 75. FIG. 8 is a cross-sectional diagram of rail positioning mechanism 75 taken along lines A—A of FIG. 6, which further includes web 70. As shown in FIGS. 7 and 8, shuttle 125 includes engagement mechanism 135, comprising pneumatic cylinder 136, anvil guide/air cylinder 140 and anvil 145. Shuttle 125 also includes shuttle sensor 150 having a light emitting diode (not shown) and a photodetector (not shown) separated by a gap 158. A suitable commercially available example of shuttle sensor 150 is the Omron EE-SX670/470 Photomicrosensor. Shuttle sensor 150 may also be an inductive sensor or a proximity sensor.

Engagement mechanism 135 is provided to enable shuttle 125 to selectively engage, meaning temporarily attach to and hold, any of the rails 45. Engagement is accomplished through the interaction between anvil 145 and engagement saddle 155, which, as shown in FIG. 8, is included in each web 70 of each rail 45 at a lower end thereof.

Figure 9A:
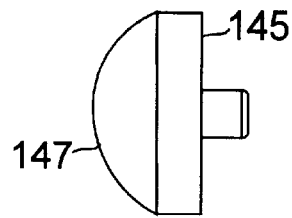
FIGS. 9A, 9B and 9C are top, side and perspective views, respectively, of the anvil which forms part of an engagement mechanism according to an aspect of the present invention.
Figure 9B:
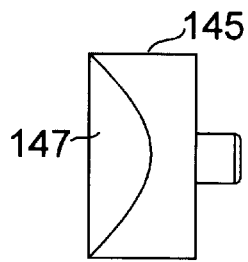
Figure 9C:
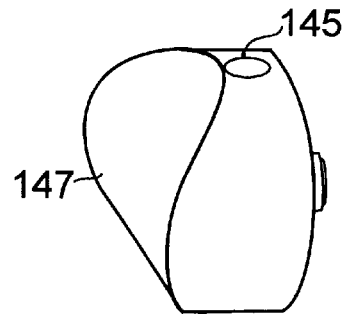
Figure 10A:
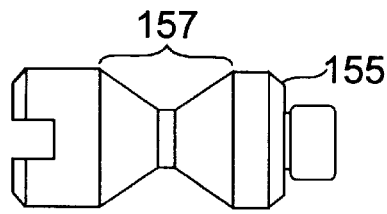
FIGS. 10A and 10B are top and perspective views, respectively, of the engagement saddle which engages with the anvil shown in FIGS. 9A, 9B, and 9C.
Figure 10B:
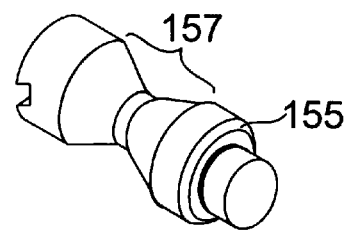

FIGS. 9A, 9B and 9C are top and side views, respectively, of anvil 145, and FIGS. 10A and 10B are top and perspective views, respectively, of engagement saddle 155. As can be seen in FIGS. 9A and 9B, anvil 145 includes rounded front face 147. Furthermore, as can be seen in FIGS. 10A and 10B, engagement saddle 155 has a generally cylindrical shape with a bevelled recessed mid-portion 157 shaped to receive the rounded front face 147 of anvil 145.

Figure 11:
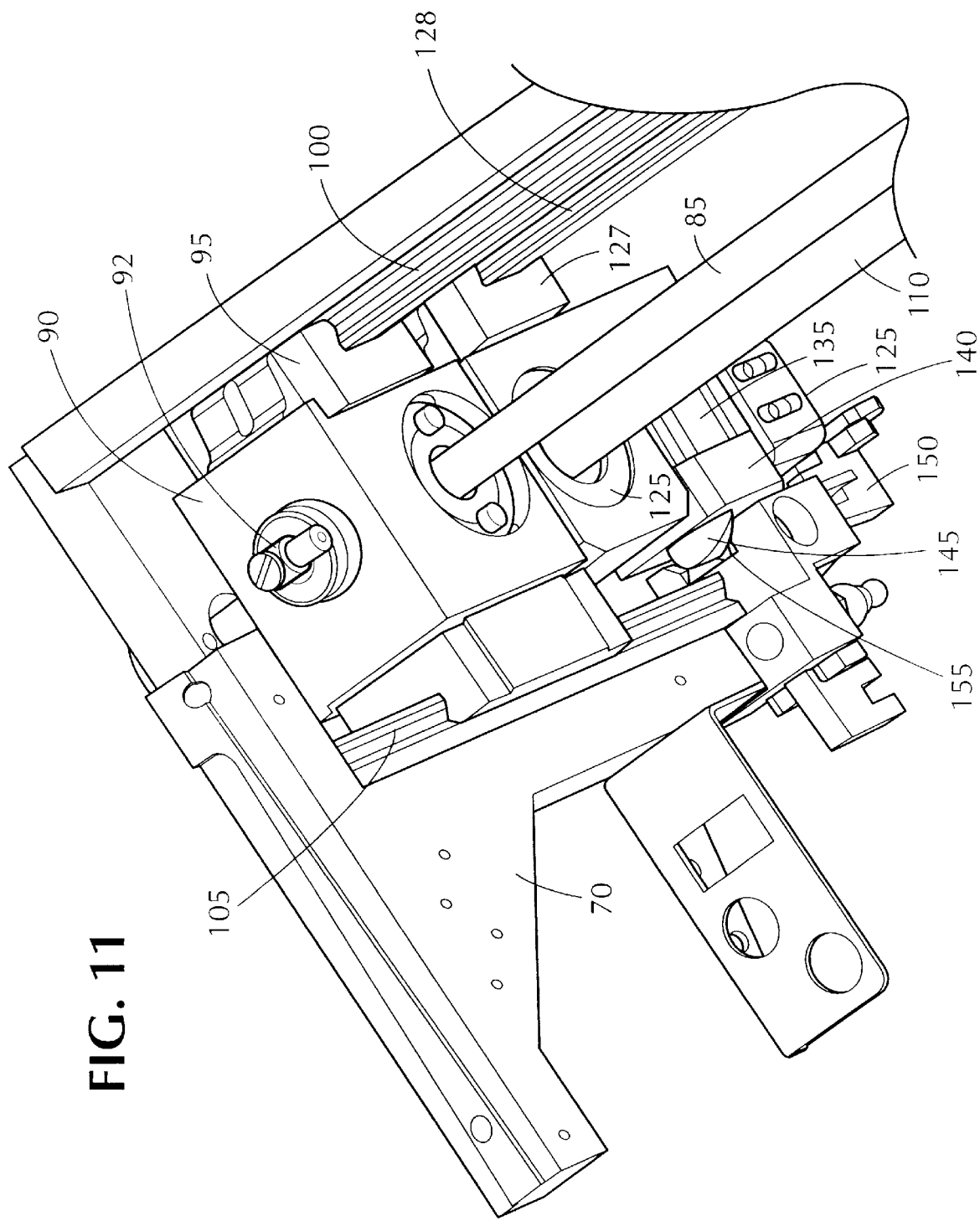
FIG. 11 is a perspective view of an end portion of the rail positioning mechanism shown in FIGS. 5, 6 and 7 showing the anvil of FIGS. 9A, 9B and 9C in engagement with the engagement saddle of FIGS. 10A and 10B.

Anvil 145 can selectively be pneumatically actuated in the directions A and B shown by the arrows in FIG. 8. When anvil 145 is fully actuated in the A direction, it engages engagement saddle 155 as shown in FIG. 11, which is a perspective view of an end portion of rail positioning mechanism 75 also showing web 70 of a rail 45. When anvil 145 engages engagement saddle 155, shuttle 125, web 70 and thus rail 45, and brake cylinder 90 are temporarily connected or linked to one another. Thus, if the corresponding opposite brake cylinders 90 of each rail positioning mechanism 75a and 75b are disengaged and therefore free to slide along brake rods 85, and if each shuttle 125 of rail positioning mechanisms 75a and 75b engages the rail 45 attached to the disengaged corresponding opposite brake cylinders 90 as described above, the rail 45 will move laterally in a direction parallel to brake rods 85 as the shuttles 125 are moved along ball screws 110 by operation of stepper motor 115. Accordingly, by selectively moving shuttles 125 of each rail positioning mechanism 75a and 75b along the length of ball screws 110, and by selectively engaging shuttles 125 with rails 45 as described above, each of the rails 45 can be selectively moved and placed along the length of brake rods 85. In this manner, the width of the lanes formed by two adjacent rails 45 can be adjusted to accommodate printed circuit boards of varying widths.

Referring again to FIG. 8, attached to the lower end of each web 70 of each rail 45 is flag 160, also commonly called a vane, comprising a piece of sheet metal or the like. Flag 160 enables shuttle 125 to locate or sense rails 45. Specifically, when operative, shuttle sensor 150 provides a beam of light across gap 158. When shuttle 125 is moved along ball screw 110 by stepper motor 115 and shuttle 125 is aligned with a rail 45 in an orientation wherein anvil 145 can properly engage engagement saddle 155, flag 160 of the rail 45 will be located within gap 158 and thus will block the beam of light. As a result, shuttle sensor 150 is able to sense or detect that the shuttle 125 has located a rail 45.

System 40 is provided with software control loaded into a control computer or microprocessor that is able to store and update the location of each rail 45 along brake rods 85 and the location of the shuttles 125 along ball screws 110. The software control also enables the system 40 to move to shuttles 125 to particular locations along the length of ball screws 110 by specifically controlling stepper motor 115. The word location as used herein refers to the distance from a known reference or home position. In particular, the distance traveled along the ball screws 110 by shuttles 125 translates into a number of steps or counts of the stepper motor 115. Thus, if, for example, it is desired to move the shuttle 125 to a location six inches from its current location, that six inches will correspond to a particular number of steps or counts of the stepper motor 115. The location of the shuttles 125 is constantly updated and stored each time the shuttles 125 are moved. Similarly, as noted above, the software control keeps track of the specific location of each rail 45 along the brake rods 85. Thus, if, for example, it is desired to move a particular rail 45 to a new location three inches to the left of its current location, the shuttles 125 will locate and engage the rail 45 in one of the manners described above and below, and will move the rail 45 by moving the shuttles 125 through a particular number of steps or counts of the stepper motor 115 that corresponds to three inches.

Furthermore, because a multiple number of rails 45 are provided, it is necessary to be able to locate a particular rail 45. In one embodiment, the software control enables the shuttles 125 to locate a particular rail 45 by keeping track of the location of shuttles 125 with reference to the rails 45, i.e., the shuttles 125 are between the first and second rails, or between the second and third rails, etc. Thus, if, for example, the shuttles 125, which travel directly opposite one another along ball screws 110, are located between the first and second rails 45 and it is desired to move the fourth rail 45, the shuttles 125 will be moved along ball screw 110 by stepper motor 115 until three rails 45 have been sensed by shuttle sensor 150 due to interruption of the light beam in gap 158. At this point, the software control will know that the third sensed rail 45 is the fourth rail. In an alternate embodiment, the software control enables the shuttles 125 to locate a particular rail 45 by moving the shuttles 125 to the stored location of the particular rail 45. Thus, if, for example, it is desired to move the fourth rail 45, the shuttles will go directly to the stored location of the fourth rail 45.

Figure 12:
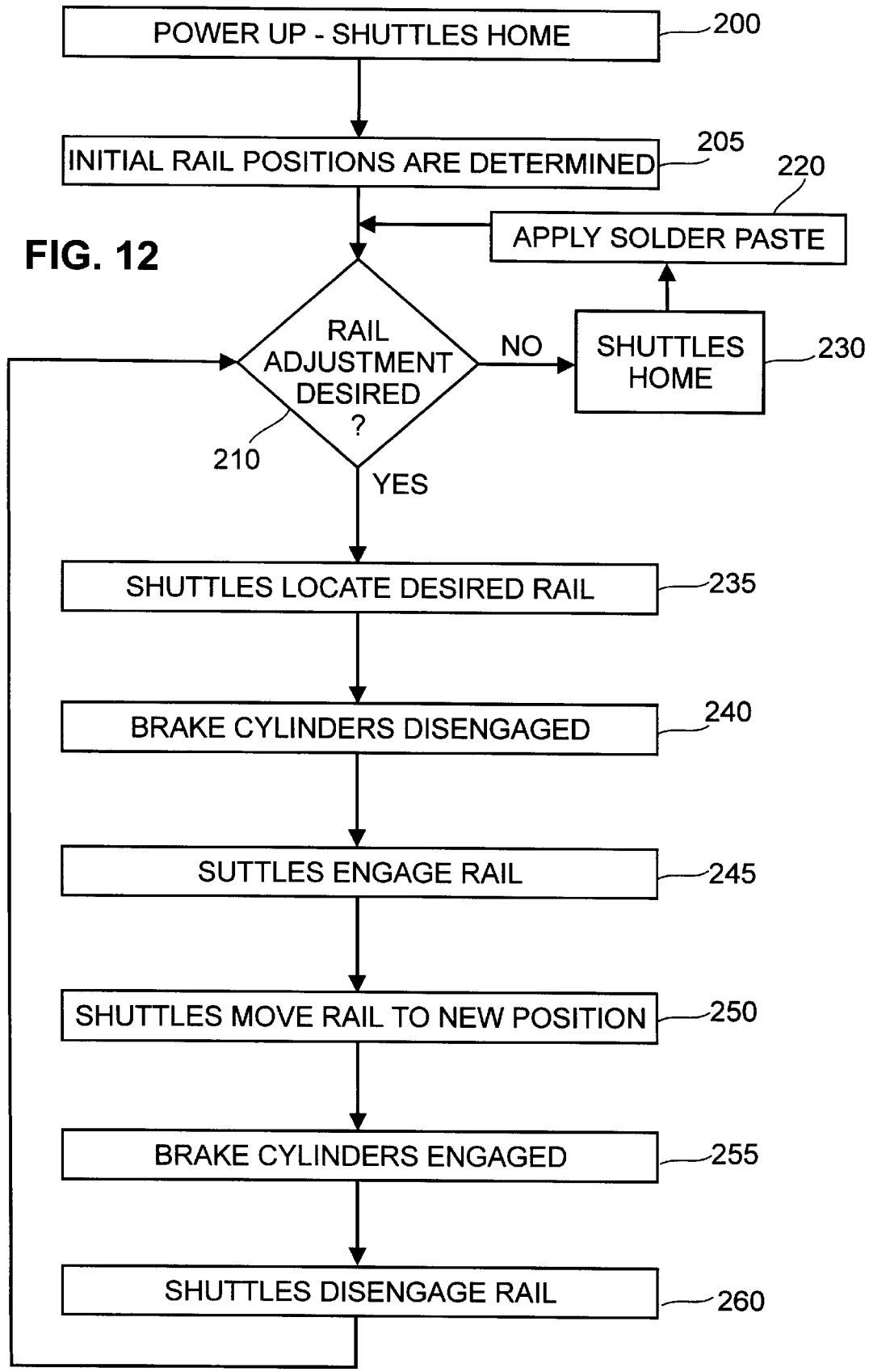
FIG. 12 is a flow chart showing the basic operation of the multi-rail, multi-lane transport system according to an aspect of the present invention.

Referring to FIG. 12, a flow chart of the basic operation of system 40 in connection with a screen printing machine is shown. The source code in the C programming language of one specific implementation in software of the operation illustrated in FIG. 12 and described above is included as a Microfiche Appendix filed herewith. The software module entitled "Widthmod" controls the shuttles 125 and the positioning of rails 45. The software module entitled "Railsmod" controls the operation of the rails 45 and the handling of the printed circuit boards. Furthermore, although the operation of system 40 is described in connection with a screen printing machine, it should be understood that this is for illustrative purposes only and that essentially the same operation would readily apply to other electronics assembly equipment such as a "pick-and-place" machine or a reflow oven or to any equipment that transports loads on a rail system as described above.

As shown in Box 200, the system is powered up and the shuttles are moved to a known home or reference position. Next, as shown in box 205, the initial positions of each of the rails 45 with respect to the home or reference position is determined and stored. This task can be achieved either by having the shuttles 125 locate each rail 45 as described above, or by reading the last rail position from a storage file. The latter option is based on the assumption that the rails 45 have not been moved since the system was last powered off.

Referring to Box 210, a determination is made as to whether the position of a particular rail 45 needs to be adjusted. If no adjustments are necessary, then, as shown in Boxes 220 and 230, the shuttles 125 return to the home position, if not already there, and the system applies solder paste to a printed circuit board. If, however, the position of a particular rail 45 needs to be adjusted, then, as shown in box 235, the shuttles 125 locate that rail. At this point, the shuttles 125 have moved to a position along ball screws 110 wherein anvils 145 of the shuttles 125 can properly engage engagement saddles 155 of the chosen rail 45. Next, as indicated in Box 240, the brake cylinders 90 of the chosen rail 45 are disengaged so that the chosen rail 45 is free to slide along brake bars 85. Referring to Box 245, in the next step the shuttles 125 engage the chosen rail 45 by actuation of the anvils 145 and engagement between the anvils 145 and the engagement saddles 155. As shown in Box 250, the chosen rail 45 is then moved to its new desired location by moving shuttles 125 along ball screws 110 by operation of stepper motor 115. As noted above, distance is measured by monitoring the number of steps or counts of stepper motor 115. Once the chosen rail 45 has been moved to its new location, then, as shown in Box 255, the brake cylinders 90 of the chosen rail are engaged, thereby fixing it in position. Next, as shown in box 260, the shuttles 125 disengage the chosen rail 45. As shown in Box 210, a determination is then made as to whether any other rail position adjustments are necessary. If not, then the steps of boxes 220 and 230 described above are repeated. If, however, additional rail adjustments are desired, the steps of Boxes 235 through 260 as described above are repeated until no other rail adjustments are needed, in which case the steps of Boxes 220 and 230 are repeated.

In an alternate embodiment of the present invention, the selective adjustment of each of the rails 45 is accomplished manually. In this alternate embodiment, shuttles 125, ball screws 110 and stepper motor 115 are eliminated. Furthermore, the brake cylinders 90, rather than being pneumatically engaged and disengaged, may instead be engaged and disengaged manually by a screw which replaces air nozzle 92. Thus, an operator can manually adjust any one of the rails 45 by disengaging the appropriate brake cylinders 90, either pneumatically as described above or manually using the screw, manually moving the rail 45 along the brake rods 85 to the desired position, and engaging the brake cylinders 90, either pneumatically or manually using the screw, at the desired new position.

Figure 13:
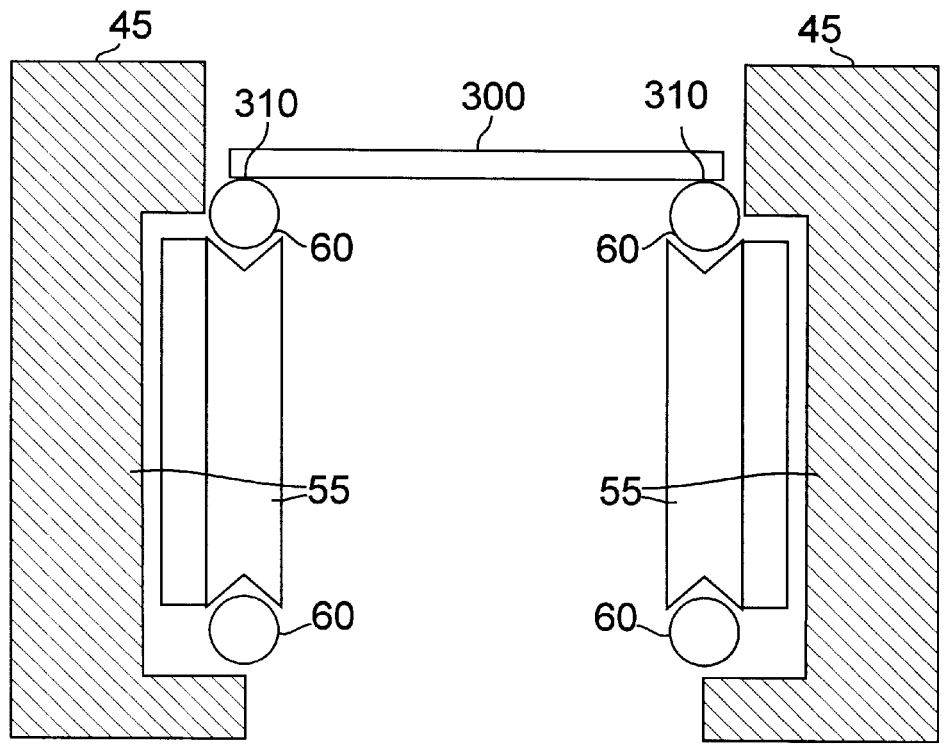
FIG. 13 is a cross-sectional diagram showing two rails of the multi-rail, multi-lane transport system according to an aspect of the present invention taken along lines B—B of FIG. 3.
Figure 14:
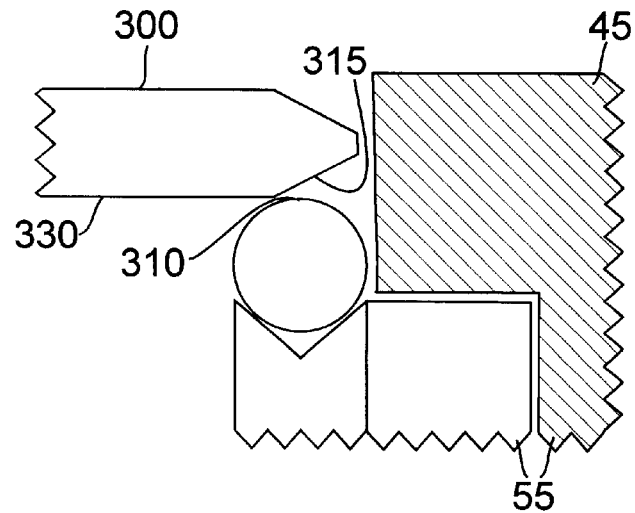
FIG. 14 is a cross-sectional diagram showing a rail with a printed circuit board having a chamfered edge supported thereon.

In the embodiment of the present invention 60 shown in FIGS. 2 and 3, belts 60 have a round shape. FIG. 13 is a cross-sectional view showing two rails 45 and belts 60 with a printed circuit board supported thereon taken along lines B—B of FIG. 3. As can be seen in FIG. 13, printed circuit board 300 is supported at its flat bottom by belt 60 at point 310. For printed circuit boards having bottom and side edges that meet at right angles as shown in FIG. 13, belts 60 having a round shape typically provide sufficient support. However, some printed circuit boards have edges that include a chamfer 315 as shown in FIG. 14. If a belt 60 having a round shape is used in connection with these types of printed circuit boards, the printed circuit board may rest on its chamfer 315 rather than on a flat bottom portion thereof, resulting in an error because that printed circuit board will actually be sitting lower than expected. This error may result in an excess volume of solder paste being applied by a screen printing machine which may result in what is commonly known as bridging, meaning one pad of the printed circuit board may touch another. The further to the left in FIG. 14, i.e., the further up the chamber 315, that the printed circuit board 300 rests, the greater the error.

Figure 15:
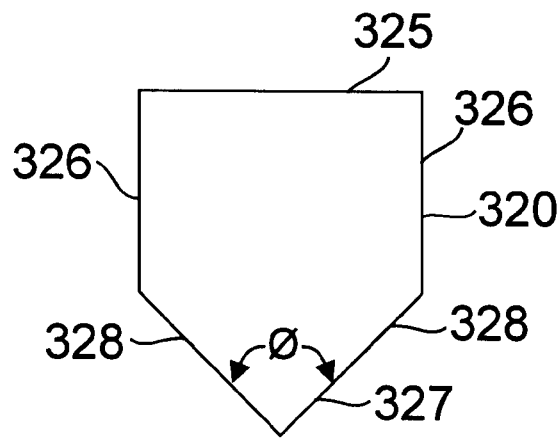
FIG. 15 is a cross-sectional diagram of a belt having a custom extruded profile according to an alternative embodiment of the present invention.
Figure 16:
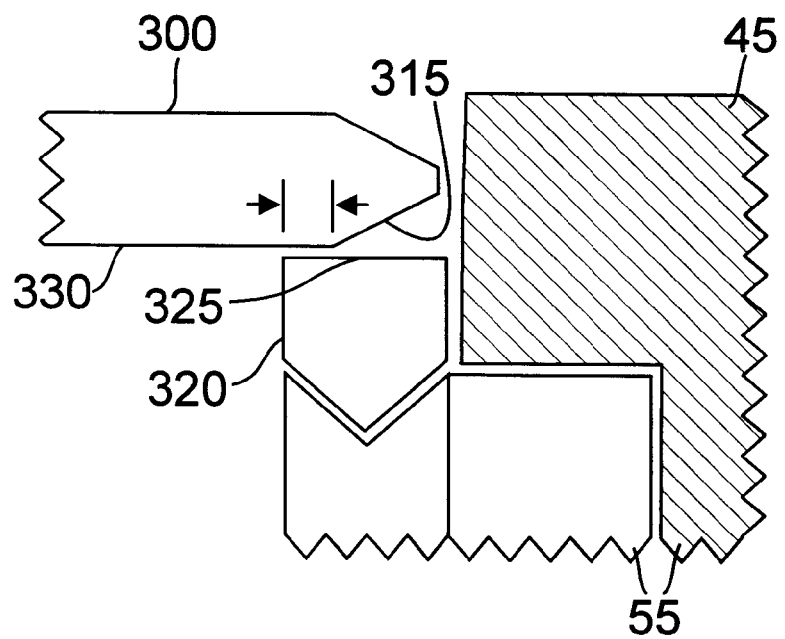
FIG. 16 is a cross-sectional diagram showing a rail including the belt of FIG. 15 with a printed circuit board having a chamfered edge supported thereon.

In an alternate embodiment of the present invention, in order to reduce the potential for error caused by chamfer 315, a belt 320 having a custom extruded profile is provided. A cross-sectional diagram of belt 320 is shown in FIG. 15. Belt 320 includes flat support surface 325, side walls 326 substantially perpendicular to flat support surface 325 and V-shaped bottom portion 327 having bottom walls 328. As shown in FIG. 16, flat support surface 325 ensures that a printed circuit board 300 having a chamfer 315 will not be supported on its chamfer 315, but instead will be supported on the flat bottom surface 330 of printed circuit board 300. As a result, the error discussed above is eliminated. Furthermore, belt 325 provides the added benefit of an increased area for supporting printed circuit board 300, delineated by the arrows shown in FIG. 16. In contrast, with round belts, as noted above, support generally comes from only a single point 310 on the belt 60. In one specific embodiment, bottom walls 328 form an angle on the order of 120°. It should be noted, however, that in order to avoid the error discussed above, it is only necessary that a belt having a flat support surface 325 be provided. That is, V-shaped bottom portion 327 can be replaced by a bottom portion having any shape, for example round, without departing from the scope of the present invention.

Figure 18:
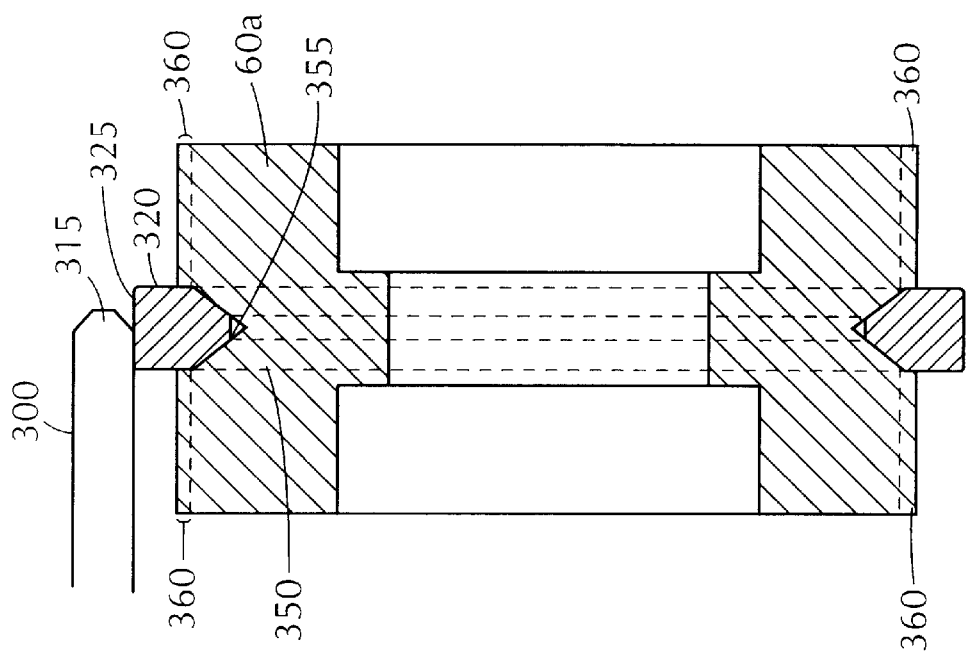
FIG. 18 is a cross-sectional diagram of the belt and pulley according to a further aspect of the present invention taken along lines C—C of FIG. 3.
Figure 17:
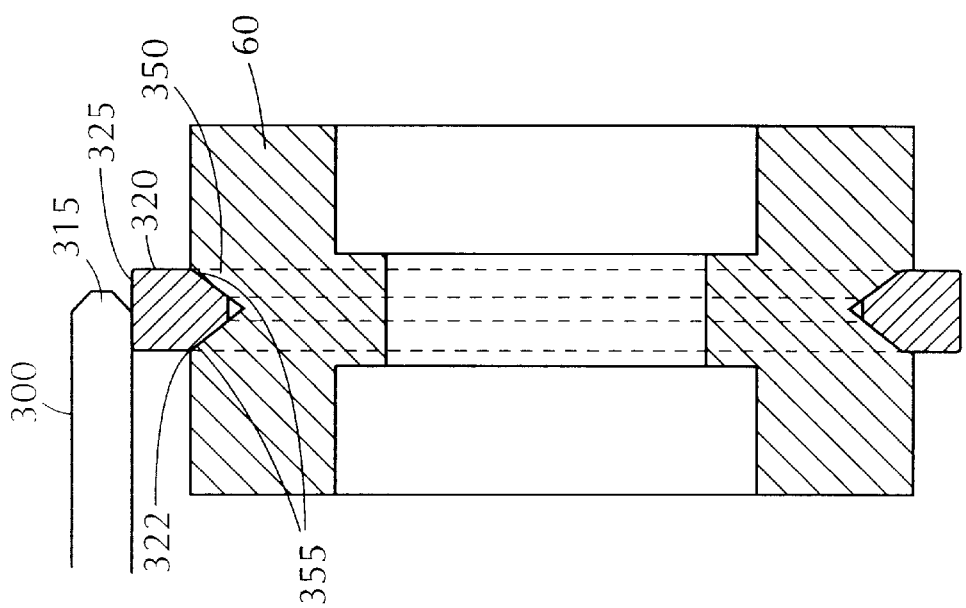
FIG. 17 is a cross-sectional diagram of the belt and pulley according to an aspect of the present invention taken along lines C—C of FIG. 3.

Referring to FIG. 17, a cross-sectional diagram of pulley 60 and belt 320 taken along lines C—C of FIG. 3 is shown. As illustrated in FIG. 17, when a printed circuit board, such as printed circuit board 300 having chamfer 315, is supported on belt 320, the downward force exerted by the printed circuit board may have the tendency to cause the belt 320 to pivot at point 322 and roll out of the groove 350 of pulley 60 in which the belt 320 sits. Thus, in order to remedy this potential problem, an alternate embodiment of pulley 60, denoted as 60a in FIG. 18 is provided. Like FIG. 17, FIG. 18 is a cross-sectional diagram taken along lines C—C of FIG. 3. As can be seen in FIG. 18, pulley 60a is provided with additional support portions 360 surrounding groove 350 which extend in a direction substantially parallel to side walls 328 of belt 320. Support portions 360 are denoted by the dotted lines in FIG. 18. In effect, the support portions 360 make groove 350 deeper. The support portions 360 thus provide additional support for belt 320 by engagement therewith to counteract the force exerted by the printed circuit board and thereby prevent the belt 320 from rolling out of the groove 350. In addition, the angle formed by the opposite side walls 355 is chosen to match the profile of V-shaped bottom portion 327.

Figure 19:
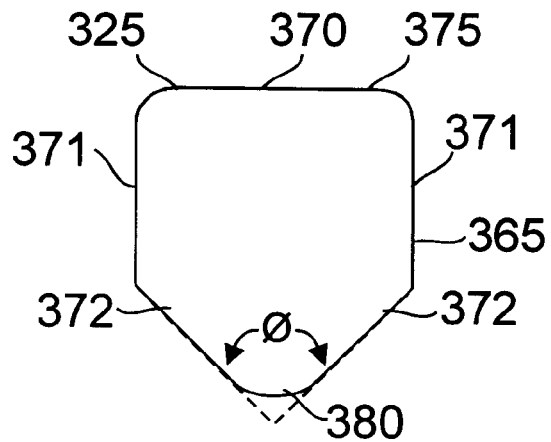
FIG. 19 is a cross-sectional diagram of a belt having a custom extruded profile according to a further alternative embodiment of the present invention.
Figure 20:
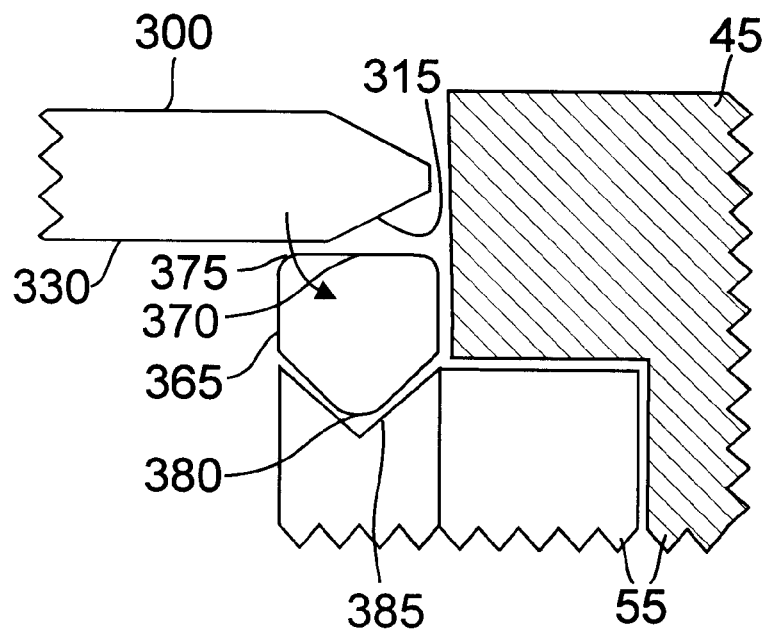
FIG. 20 is a cross-sectional diagram showing a rail including the belt of FIG. 19 with a printed circuit board having a chamfered edge supported thereon.

Referring to FIG. 19, a cross-sectional diagram of a belt 365 according to a further alternate embodiment of the present invention is shown. Belt 365 includes flat support surface 370, side walls 371 substantially perpendicular to flat surface 370 and bottom walls 372. The purpose of flat support surface 370 is identical to flat support surface 325 shown in FIGS. 15 and 16. Belt 365 further includes rounded edge portions 375, and may include rounded bottom 380, although the latter is not necessary. Rounded bottom 380 is provided in order to facilitate the manufacture of belt 365. In particular, a preferred method of manufacturing belt 365 is by custom extrusion, and rounded bottom 380 will generally help to reduce friction and wear in the die and may help to prevent twisting and curling of the belt 365 during manufacture. If rounded bottom 380 is not provided, then side walls 372 meet to form a V as described above. Rounded edge portions 375 are provided to help prevent belt 365 from rolling out of the groove 385 formed in the support structure of rail 45 and from rolling out of the groove 350 formed in pulleys 60 and 60a (shown in FIGS. 17 and 18). In particular, when a printed circuit board, such as printed circuit board 300 having a chamfer 315, Is supported on belt 365, the printed circuit board tends to bow and exert a force as shown by the arrow in FIG. 20. This force will counteract any force that may tend to cause belt 365 to roll as described above.

Figure 21:
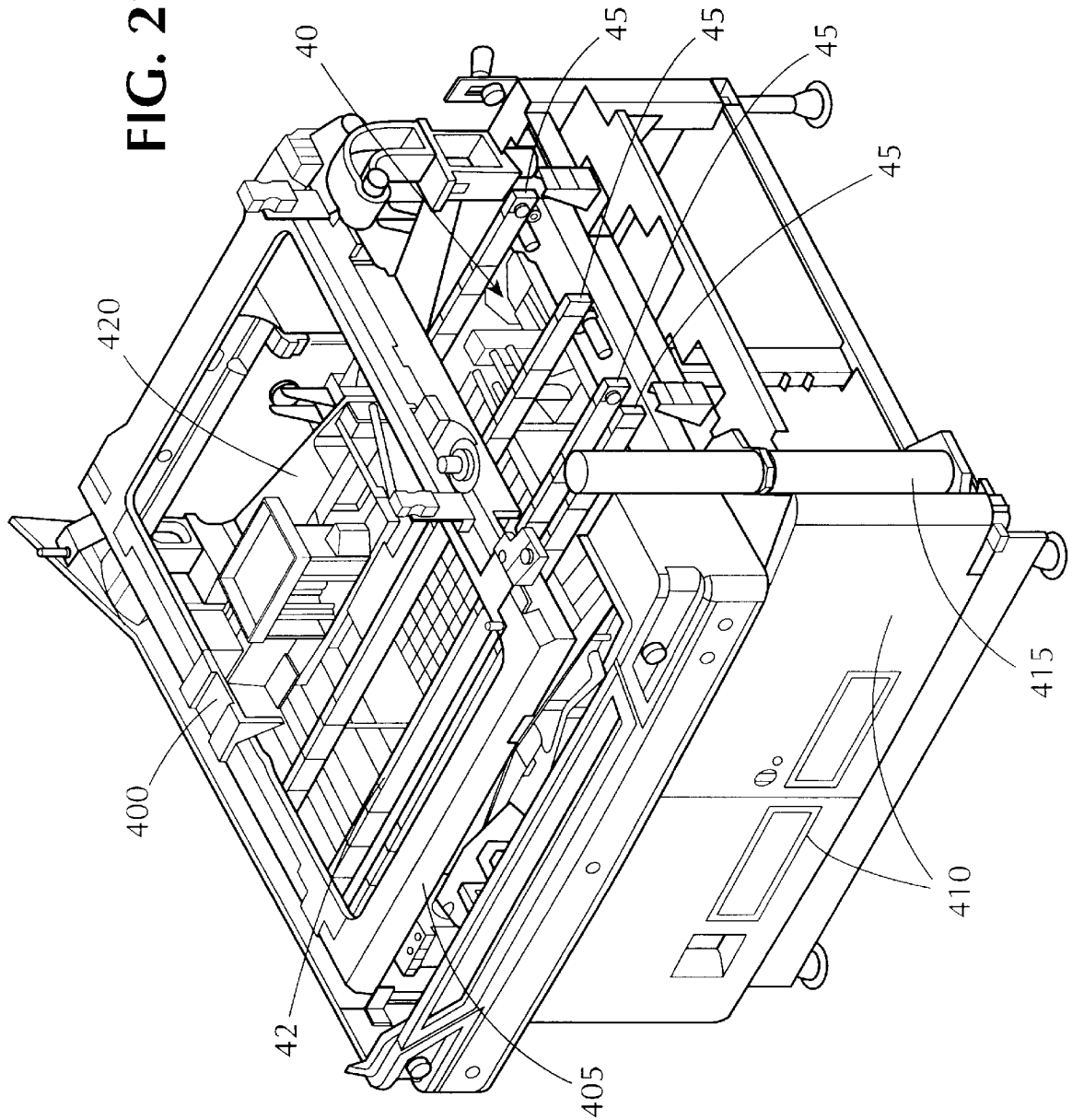
FIG. 21 is a perspective view of an embodiment of a multi-rail, multi-lane transport system according to an aspect of the present invention implemented in connection with a screen printing machine.

Referring to FIG. 21, a perspective view of the multi-rail transport system according to an aspect of the present invention implemented in connection with a DEK model 265 GSX screen printing machine is shown. As can be seen in FIG. 21, the screen printing machine includes squeegee head 400, print head frame 405, front access panels 410, monitor support arm 415 and main support 420.

Figure 22:
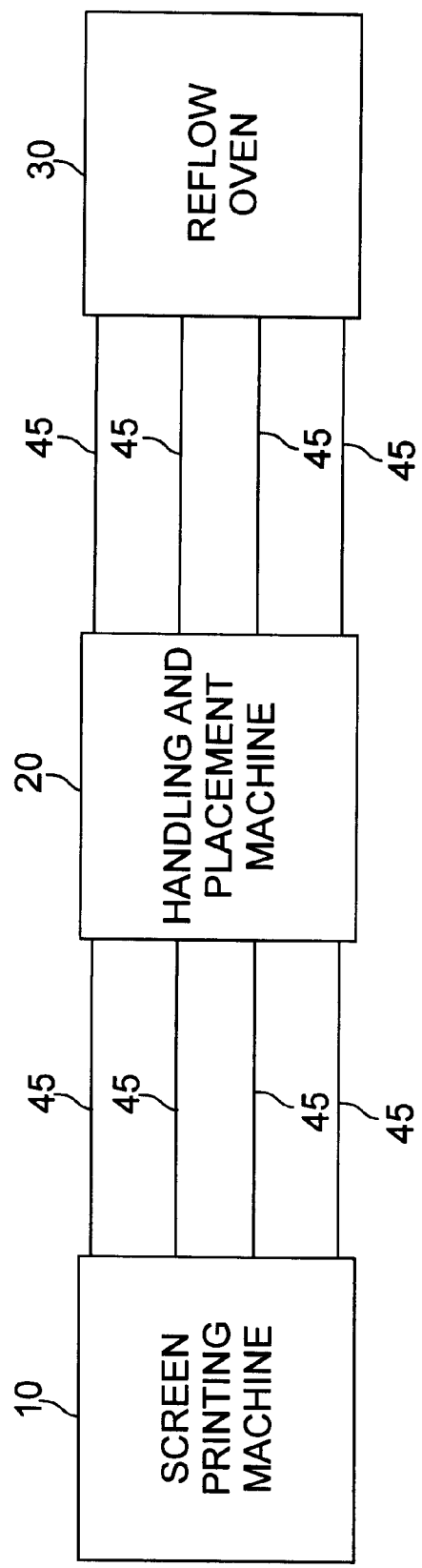
FIG. 22 is a block diagram of a multi-rail, multi-lane printed circuit board assembly system according to an aspect of the present invention.

Thus, referring to FIG. 22, the multi-rail transport system according to any one of the above-described embodiments can be used in the manufacture of printed circuit boards having electronics components mounted on the surface thereof, which may, for example include screen printing, component placement and reflow steps as described above. Again, it should be noted that the present invention is not limited to use in connection with screen printing, component placement and reflow processes, but instead is applicable to any system in which rigid or flexible printed circuit boards are transported along rails. The present invention is also more generally applicable to any system in which loads, such as a box, are transported along rails.

One skilled in the art will appreciate that the present invention can be practiced by other than the described embodiments, which are presented for purposes of illustration and not of limitation.

We claim:

1. A multi-rail transport system for transporting printed circuit boards along adjacent pairs of rails, said rails adapted to transport said printed circuit boards, the system comprising:
   a plurality of said transporting rails located along an axis of movement;
   means for switching each of said rails from a first condition in which said rails are fixed in position along said axis of movement and a second condition in which said rails are free to move along said axis of movement;
   means for selectively engaging said rails; and
   means for selectively moving said rails along said axis of movement.

2. A multi-rail transport system according to claim 1, wherein said rails are coupled to and move along first and second brake rods.

3. A multi-rail transport system according to claim 1, wherein said moving means further comprises means for sensing said rails.

4. A multi-rail transport system according to claim 1, wherein said moving means further comprises means for sensing said rails.

5. A multi-rail transport system according to claim 1, wherein said means for switching comprises a manually actuated brake cylinder.

6. A multi-rail transport system according to claim 1, wherein said rails comprise a belt, a pulley, a motor for driving said pulley, and a support structure.

7. A multi-rail transport system according to claim 6, wherein said belt has a round cross-section.

8. A multi-rail transport system according to claim 6, wherein said belt has a cross-section having a substantially flat surface for supporting said printed circuit boards.

9. A multi-rail transport system according to claim 8, wherein said cross-section of said belt further comprises first and second side walls substantially perpendicular to said substantially flat surface and wherein said pulley comprises a groove adapted to receive said belt, said groove having first and second support portions for engaging and supporting said first and second side walls, respectively.

10. A multi-rail transport system according to claim 8, wherein said cross-section of said belt further comprises a rounded edge portion located at an end of said substantially flat surface.

11. A multi-rail transport system according to claim 1, further comprising means for storing and updating a location of said rails along said axis of movement.

12. A multi-rail transport system according to claim 2, further comprising means for storing and updating a location of each of said rails along said first and second brake rods.

13. A multi-rail transport system for transporting loads along adjacent pairs of rails, said rails adapted to transport said loads, the system comprising:
   a plurality of said transporting rails located along an axis of movement;
   means for switching each of said rails from a first condition in which said rails are fixed in position along said axis of movement and a second condition in which said rails are free to move along said axis of movement;
   means for selectively engaging said rails; and
   means for selectively moving said rails along said axis of movement.

14. A method of adjusting rails in a multi-rail transport system, comprising:
   providing a plurality of rails along an axis of movement, each of said rails being adapted to be switched between a first condition in which said rails are fixed in position along said axis of movement, and a second condition in which said rails are free to move along said axis of movement;
   providing a shuttle moveable along said axis of movement, said shuttle being adapted to selectively engage and disengage each of said rails such that when said shuttle engages a rail, said shuttle and said engaged rail are linked to one another;
   moving said shuttle along said axis of movement to a position adjacent to a selected one of said rails;
   switching said selected one of said rails to said second condition;
   engaging said selected one of said rails with said shuttle;
   moving said shuttle and said selected one of said rails to a new position along said axis of movement;
   switching said selected one of said rails to said first condition; and
   disengaging said selected one of said rails with said shuttle.

15. A method according to claim 14, wherein said rails are moveably mounted to first and second brake rods by first and second brake cylinders, respectively, and wherein said rails are switched between said first condition and said second condition by actuating said brake cylinders between an engaged condition in which said brake cylinders are fixed in place along said brake rods and a disengaged condition in which said brake cylinders are free to move along said brake cylinders.

16. A method according to claim 14, wherein said shuttle is affixed to a ball nut threaded onto a ball screw, said ball screw being driven by a stepper motor.

17. A method according to claim 14, wherein said shuttle further comprises a sensor, and wherein said step of moving said shuttle to a position adjacent to a selected one of said rails further comprises sensing a flag attached to said selected one of said rails with said sensor.

18. A method according to claim 14, said step of moving said shuttle to a position adjacent to a selected one of said rails comprises moving said shuttle to a stored location of said selected one of said rails along said axis of movement.

19. A method according to claim 14, further comprising storing said new position.

20. A multi-rail transport system for transporting printed circuit boards along adjacent pairs of rails, said rails adapted to transport said printed circuit boards, the system comprising:
   a plurality of said transporting rails located along an axis of movement;
   a pneumatically actuated brake cylinder for switching said rails from a first condition in which said rails are fixed in position along said axis of movement and a second condition in which said rails are free to move along said axis of movement; and
   means for selectively moving said rails along said axis of movement.

21. The multi-rail transport system according to claim 1, wherein the means for selectively engaging comprises:

a first shuttle adapted to move in a -first direction substantially parallel to said axis of movement and to selectively engage first ends of said rails; and a second shuttle adapted to move in a second direction substantially parallel to said axis of movement and to selectively engage second ends of said rails.

22. A multi-rail transport system according to claim 21, wherein the means for selectively moving comprises:

a first ball screw having a first ball nut threaded thereon;

a second ball screw having a second ball nut threaded thereon; and a stepper motor for driving said first and second ball screws, wherein said first shuttle is affixed to said first ball nut and said second shuttle is affixed to said second ball nut.

23. A multi-rail transport system according to claim 22, wherein said first and second ball screws are coupled to one another by a belt and pulley system.

24. A multi-rail transport system according to claim 22, further comprising means for storing and updating a location of said first and second shuttles along said first and second ball screws, respectively.

25. A multi-rail transport system according to claim 22, further comprising means for controlling said stepper motor to move said first and second shuttles to particular locations along said first and second ball screws, respectively.

26. A multi-rail transport system according to claim 21, wherein said rails further comprise flags attached to said first and second ends thereof and wherein said first and second shuttles further comprise sensors for sensing said flags.

27. A multi-rail transport system according to claim 26, wherein said sensors are optical sensors.

28. A multi-rail transport system according to claim 21, wherein said first and second shuttles further comprise an anvil adapted to be selectively actuated between an engaging and a non-engaging position, wherein said rails further comprise first and second engagement saddles attached to said first and second ends thereof, respectively, wherein when said first and second shuttles are aligned with said first and second ends, respectively, of one of said rails and when said anvils are actuated to said engaging position, said anvil of said first shuttle engages said first engagement saddle of said one of said rails and said anvil of said second shuttle engages said second engagement saddle of said one of said rails such that said first and second shuttles and said one of said rails are linked to one another.

29. A multi-rail transport system according to claim 28, wherein when said first and second shuttles and said one of said rails are linked to one another said one of said rails will move in a direction substantially parallel to said first and second longitudinal axes as said shuttles are moved in said first and second directions.

* * * * *